(12) United States Patent
Jun et al.

(10) Patent No.: US 6,987,315 B2
(45) Date of Patent: Jan. 17, 2006

(54) CERAMIC MULTILAYER SUBSTRATE

(75) Inventors: Seok Taek Jun, Suwon (KR); Myoung Lib Moon, Seoul (KR); Duk Woo Lee, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 183 days.

(21) Appl. No.: 10/340,680

(22) Filed: Jan. 13, 2003

(65) Prior Publication Data

US 2004/0099942 A1 May 27, 2004

(30) Foreign Application Priority Data

Nov. 25, 2002 (KR) .............................. 10-2002-0073623

(51) Int. Cl.
*H01L 21/311* (2006.01)

(52) U.S. Cl. ................. 257/703; 257/700; 257/701; 257/702; 257/704; 257/705

(58) Field of Classification Search ......... 257/701–707, 257/710, 774–784
See application file for complete search history.

(56) References Cited

U.S. PATENT DOCUMENTS

| | | | |
|---|---|---|---|
| 4,963,843 | A | 10/1990 | Peckham |
| 5,625,935 | A | 5/1997 | Kubota et al. |
| 5,644,107 | A | 7/1997 | Kubota et al. |
| 5,736,681 | A | 4/1998 | Yamamoto et al. |
| 6,041,496 | A | 3/2000 | Haq et al. |
| 6,311,390 | B1 | 11/2001 | Abe et al. |
| 6,509,531 | B2 * | 1/2003 | Sakai et al. .................. 174/264 |
| 6,528,875 | B1 * | 3/2003 | Glenn et al. ................. 257/704 |
| 2002/0064029 | A1 | 5/2002 | Pohjonen |
| 2003/0128096 | A1 | 7/2003 | Mazzochette |

FOREIGN PATENT DOCUMENTS

| | | |
|---|---|---|
| JP | 4-168795 | 6/1992 |
| JP | 5-218653 | 8/1993 |
| JP | 5-327222 | 12/1993 |
| JP | 06-215982 | 8/1994 |
| JP | 08-037251 | 2/1996 |
| JP | 11-67587 | 3/1999 |

OTHER PUBLICATIONS

Patent Abstracts of Japan—Publication No. 10–247766, Published Sep. 14, 1998.
Patent Abstracts of Japan—Publication No. 10–070364, Published Mar. 10, 1998.
U.S. Appl. No. 2002/0122301, Published Sep. 5, 2002.
U.S. Appl. No. 2001/0022545, Published Sep. 20, 2001.
Patent Abstracts of Japan, Publication No. 2002270465, Published Sep. 20, 2002.
Patent Abstracts of Japan, Publication No. 10275979, Published Oct. 13, 1998.

* cited by examiner

*Primary Examiner*—Dung A. Le
(74) *Attorney, Agent, or Firm*—Lowe Hauptman & Berner, LLP

(57) ABSTRACT

A ceramic multilayer substrate includes a plurality of ceramic substrates being stacked vertically, each substrate having a designated thickness; pattern layers formed on surfaces of the ceramic substrates so as to form circuit elements; external terminal vertically formed on side surfaces of the stacked ceramic substrates; and internal connection parts, each of which is formed on a part of one of the pattern layers, is connected to one of the external terminals so as to exchange signals with the outside, and is broad enough to surround at least partially the connected external terminal.

23 Claims, 14 Drawing Sheets

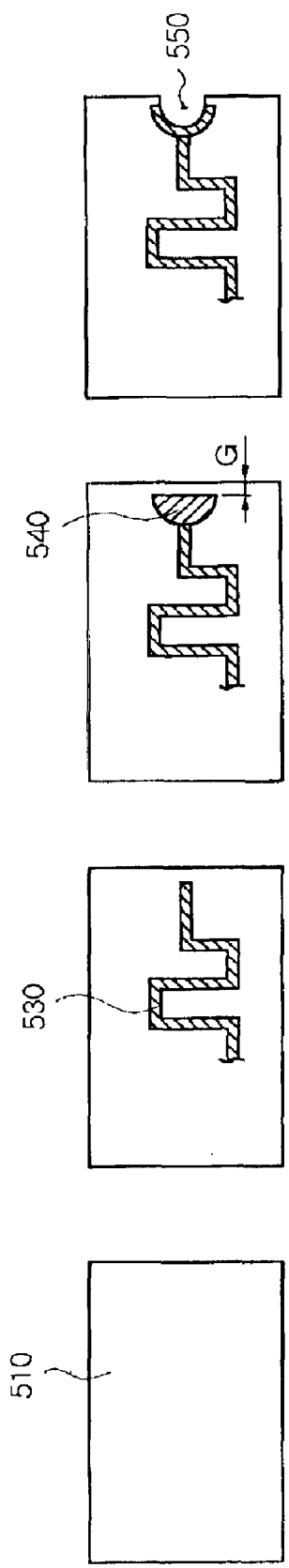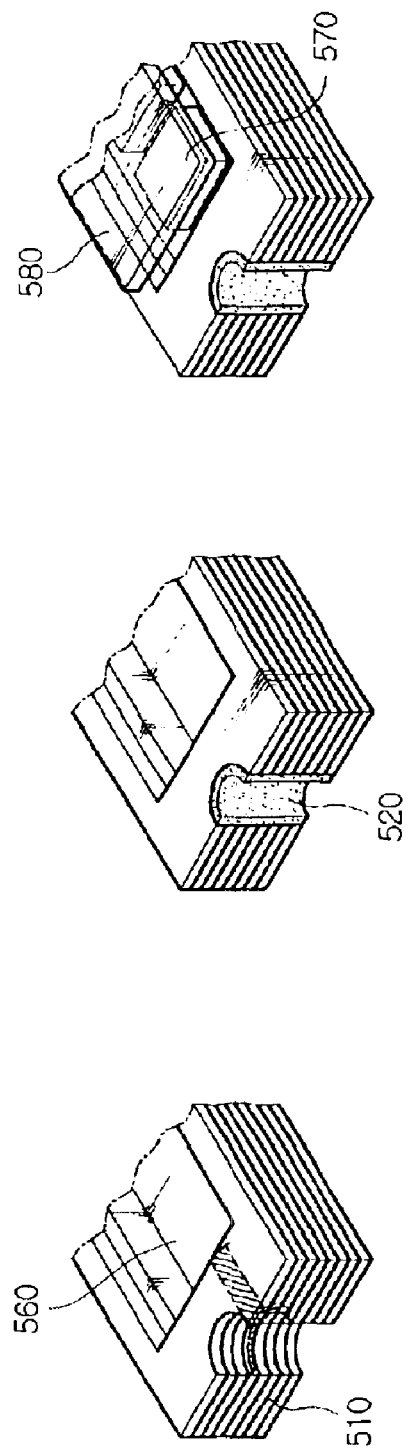

CERAMIC MULTILAYER SUBSTRATE

BACKGROUND OF THE INVENTION

1. Field of the Invention

The present invention relates to ceramic multilayer substrate in which a connection between internal patterns and an external terminal is stably achieved, and a method for manufacturing the substrate, and more particularly to a low temperature co-fired ceramic multilayer substrate in which internal connection parts formed in the internal patterns are broader enough to surround the external terminal, and a method for manufacturing the substrate, thereby stably achieving a connection between the internal patterns and the external terminal and maintaining the connection even in the case of an error occurring in a step for forming a through hole on the substrate.

Further, the present invention relates to a low temperature co-fired ceramic multilayer substrate in which the internal connection part not being connected to the external terminal is not exposed at the outer surface of the substrate, and a method for manufacturing the substrate, thereby not breaking a vacuum state generated within a space for mounting a surface acoustic wave filter chip within the substrate and preventing cracks from forming on the outer surface of the substrate.

2. Description of the Related Art

A technique for manufacturing a low temperature co-fired ceramic (hereinafter, being referred to as "LTCC") substrate is a process in which an internal electrode and passive elements (R, L, and C) for given circuits are formed a green sheet made of glass ceramic by a screen printing method using a metal with high electric conductivity such as Ag, Cu, or etc., and a plurality of the green sheets are stacked vertically and then fired (generally at less than 1,000° C.) so as to manufacture MCM (multi-chip modules) and multi-chip packages.

Since the ceramic substrate and the metallic elements are co-fired, the LTCC technique can form the passive elements (R, L, and C) within a module, thereby obtaining a complex configuration including many components and being advantageous in terms of miniaturization.

Since the LTCC substrate comprises the embedded passive elements, the LTCC substrate can be formed as a SOP (System-On-Package), thereby minimizing a parasitic effect generated in SMD (Surface Mounted Device) type components. Further, the LTCC substrate reduces electrical noise generated at soldering parts in surface mounting, thereby improving electrical characteristics of the manufactured device, and reduces the number of solderings, thereby improving the reliability of the manufactured device. Moreover, the LTCC substrate minimizes a temperature coefficient of resonant frequency ($T_f$) by adjusting a thermal expansion coefficient, thereby controlling characteristics of a dielectric resonator.

The LTCC multilayer substrate is formed by forming circuits in a single ceramic substrate and vertically stacking a plurality of the ceramic substrates. Therefore, external terminals to be connected to the outside must be formed on an outer surface of the LTCC substrate and electrically connected to circuit patterns within the substrate.

As shown in FIG. 1, a method for manufacturing a ceramic electronic component is disclosed by Japanese Patent Laid-open Publication No. Hei6-215982. Conventionally, when components made of dielectric or magnetic material are formed on a ceramic substrate adjacent to via holes formed through the ceramic substrate, the material flows into the via holes and finally seals the via holes. Further, in case that the material within the via holes is sucked from one ends of the via holes so as to form external electrodes at the internal surfaces of through holes, air flow into the via holes is dispersed by a difference of cross sectional areas of the via holes of each layer and the external electrode is non-uniformly deposited on the inner wall of the via hole. Therefore, these problems are solved by the method for manufacturing a ceramic electronic component disclosed by the above Japanese Publication.

In the above Japanese Publication, a base substrate 7 provided with a plurality of via holes formed therethrough is prepared. A ceramic stack structure 8 having internal electrodes embedded therein is formed on the base substrate 7 so as to block the via holes of the base substrate 7. A plurality of through holes are formed on the ceramic stack structure 8 so as to correspond to the via holes of the base substrate 7, and an external electrode 10 is formed in the through hole.

In the aforementioned structure disclosed by Japanese Patent Laid-open Publication No. Hei6-215982, a connection between the external electrode 10 and the internal electrode 9 is obtained by a line contact, thereby producing a small contact area. Since the connection between the internal electrode 9 and the external terminal 10 is unstable, stability of signal input/output is reduced and a defective proportion of manufactured products is increased by an error in the process. Since the internal electrodes 9 are first formed within the ceramic stack structure 8, and then the through hole is formed on the structure 8 and the external electrode 10 is formed in the through hole, as shown in FIGS. 2A and 2B, in case a connection part between the internal electrode 9 and the external electrode 10 is small, the internal electrode 9 may be electrically blocked during a step for forming the though hole, or plating the through hole or the electrical connection between the internal electrode 9 and the external electrode 10 may be unstable. FIG. 2a shows the ceramic substrate with the through hole, and FIG. 2b shows the ceramic substrate without the through hole.

Further, when the position of the through hole is shifted by an error generated in the process, the contact area between the internal electrode 9 and the external electrode 10 is changed, and more severely the internal electrode 9 is not connected to the external electrode 10. Therefore, a defective proportion of the manufactured products is increased and the quality of the products is not easily controlled.

SUMMARY OF THE INVENTION

Therefore, the present invention has been made in view of the above problems, and it is an object of the present invention to provide a ceramic multilayer substrate in which an end of an internal pattern layer is broader enough to surround an external terminal, and a method for manufacturing the substrate, thereby stably connecting the internal pattern layer to the external terminal.

It is another object of the present invention to provide a ceramic multilayer substrate in which an internal connection part is stably connected to an external terminal even when an error is generated in a step for forming a through hole, and a method for manufacturing the substrate, thereby uniformly controlling the quality of the manufactured substrate.

It is yet another object of the present invention to provide a ceramic multilayer substrate in which an internal connection part being broader than an internal pattern layer is separated from an edge of the substrate adjacent to an area for forming an external terminal by a designated distance, and a method for manufacturing the substrate, thereby preventing the external terminal from being formed on the side surface of the substrate due to the internal connection part connected to the side surface of substrate, and preventing the leakage of vacuum from a space for mounting a SAW filter chip and the generation of the cracks.

In accordance with one aspect of the present invention, the above and other objects can be accomplished by the provision of a ceramic multilayer substrate comprising: a plurality of ceramic substrates being stacked vertically, each substrate having a designated thickness; pattern layers formed on surfaces of the ceramic substrates so as to form circuit elements; external terminals formed on side surfaces of the stack structure; and internal connection parts, each of which is formed on a part of the pattern layer, being connected to the external terminal so as to exchange signals with the outside and being broad enough to surround the external terminal.

In accordance with a further aspect of the present invention, there is provided a ceramic multilayer substrate comprising: a plurality of ceramic substrates being stacked vertically, each substrate having a designated thickness and including at least one through hole formed on its side surface; pattern layers formed on surfaces of the ceramic substrates so as to form circuit elements; external terminals, each terminal formed in the through holes of the stack structure; and internal connection parts, each of which is formed on a part of the pattern layer, being connected to the external terminal so as to exchange signals with the outside and being broad enough to surround the external terminal.

In accordance with another aspect of the present invention, there is provided a ceramic multilayer substrate comprising: a plurality of ceramic substrates being stacked vertically, each substrate having a designated thickness and including at least one through hole formed on its side surface; pattern layers formed on surfaces of the ceramic substrates so as to form circuit elements; external terminals, each terminal formed in the through holes of the stack structure; internal connection parts, each of which is formed on a part of the pattern layer, being connected to the external terminal so as to exchange signals with the outside, being broad enough to surround the external terminal, and being separated from the side surfaces of the ceramic substrates adjacent to the through holes by a designated distance; a cavity formed in an upper surface of the stack structure; electronic components mounted within the cavity; and a cover installed above the cavity so as to maintain a vacuum state within the cavity.

In accordance with still another aspect of the present invention, there is provided a method for manufacturing a ceramic multilayer substrate, comprising the steps of: preparing ceramic substrates, each substrate having a designated thickness; forming pattern layers on surfaces of the ceramic substrates so as to form circuit elements; forming internal connection parts, each of which is formed on a part of the pattern layer, being connected to an edges of the ceramic substrates so as to exchange signals with the outside and having a width larger than the width of the connected pattern layers; forming through holes on the edges of the ceramic substrates within areas of the internal connection parts, the through holes being semicircular in shape so as to be opened to the outside; stacking a plurality of the ceramic substrates; and forming an external terminal on the through holes of the stacked ceramic substrates so as to be electrically connected to the internal connection parts.

In accordance with yet another aspect of the present invention, there is provided a method for manufacturing a ceramic multilayer substrate, comprising the steps of: preparing ceramic substrates, each substrate having a designated thickness; forming pattern layers on a surface of each ceramic substrate so as to form circuit elements; forming internal connection parts, each of which is formed on a part of the pattern layer, being separated from edges of the ceramic substrates by a designated distance so as to exchange signals with the outside and having a width larger than the width of the connected pattern layers; forming through holes on the edges of the ceramic substrates within areas of the internal connection parts, the through holes being semicircular in shape so as to be opened to the outside; stacking a plurality of the ceramic substrates so that a cavity is formed in an upper surface of the stacked ceramic substrates; forming an external terminal on the through holes of the stacked ceramic substrates so as to be electrically connected to the internal connection parts; and mounting electronic components within the cavity and installing a cover on the cavity so as to maintain a vacuum state within the cavity.

A stack structure in accordance with the present invention is formed by stacking a plurality of layers, thereby producing a package. The layers are properly selected from materials having electric, dielectric, and magnetic characteristics. Particularly, the layer uses a ceramic green sheet with a designated thickness. A pattern layer is formed in a designated shape on the green sheets by depositing a metal thereon, and serves as circuit elements when the green sheets are stacked. The pattern layers are made of metal such as Ag, Cu, or etc. The plural ceramic sheets are stacked and fired at a low temperature, thereby being formed as a stack structure referred to as a "low temperature co-fired ceramic multilayer substrate".

BRIEF DESCRIPTION OF THE DRAWINGS

The above and other objects, features and other advantages of the present invention will be more clearly understood from the following detailed description taken in conjunction with the accompanying drawings, in which:

FIGS. 14A to 14G illustrate a method for manufacturing a ceramic multilayer substrate provided with a SAW chip mounted thereon in accordance with the present invention.

DESCRIPTION OF THE PREFERRED EMBODIMENTS

Figure 1:
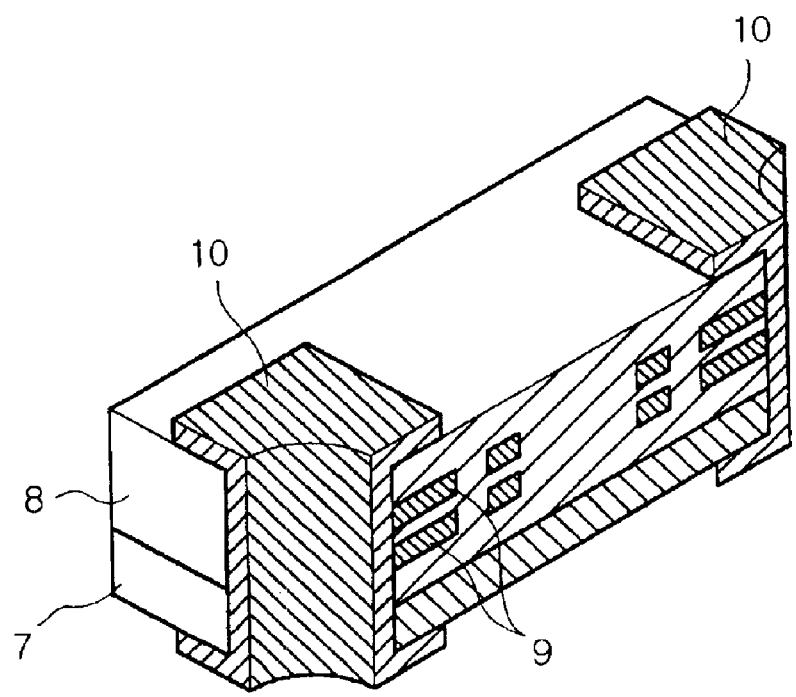
FIG. 1 is perspective view of a conventional ceramic stack structure comprising an external electrode.
Figure 2A:
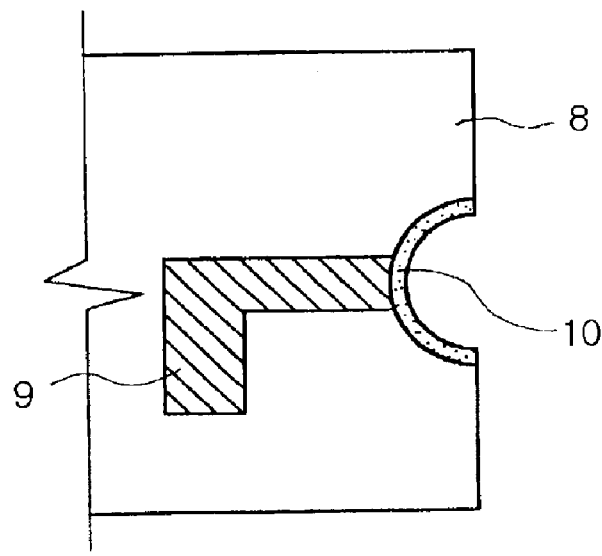
FIGS. 2A and 2B are plan views respectively showing one layer of the ceramic stack structure of FIG. 1.
Figure 2B:
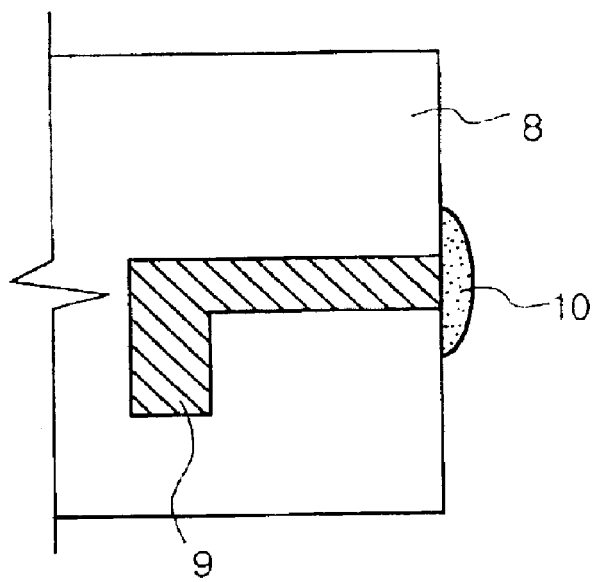
Figure 3:
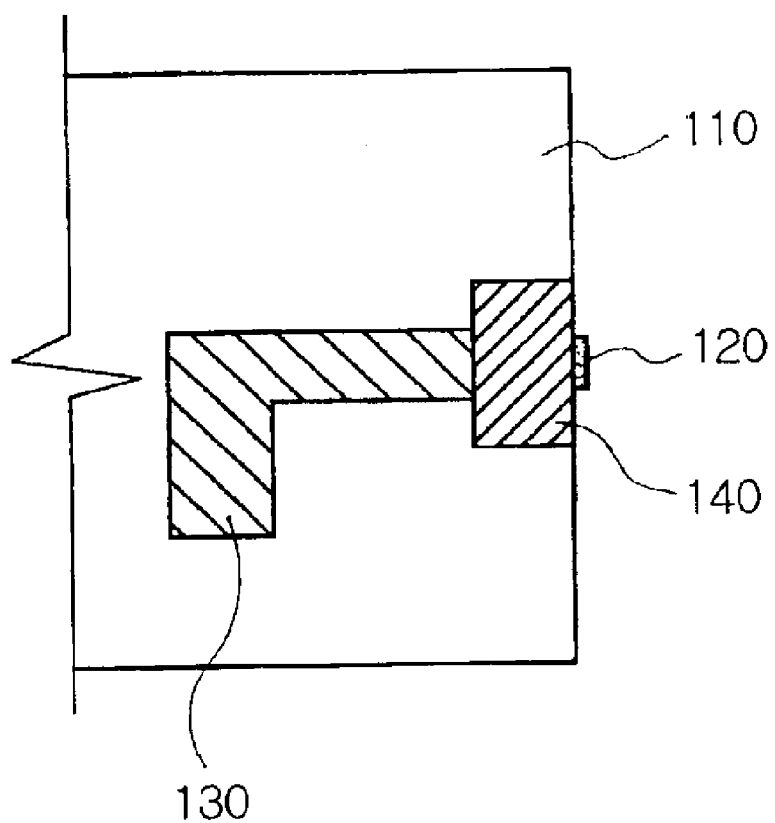
FIG. 3 is a plan view of one ceramic substrate of a low temperature co-fired ceramic multilayer substrate in accordance with a first embodiment of the present invention.
Figure 4:
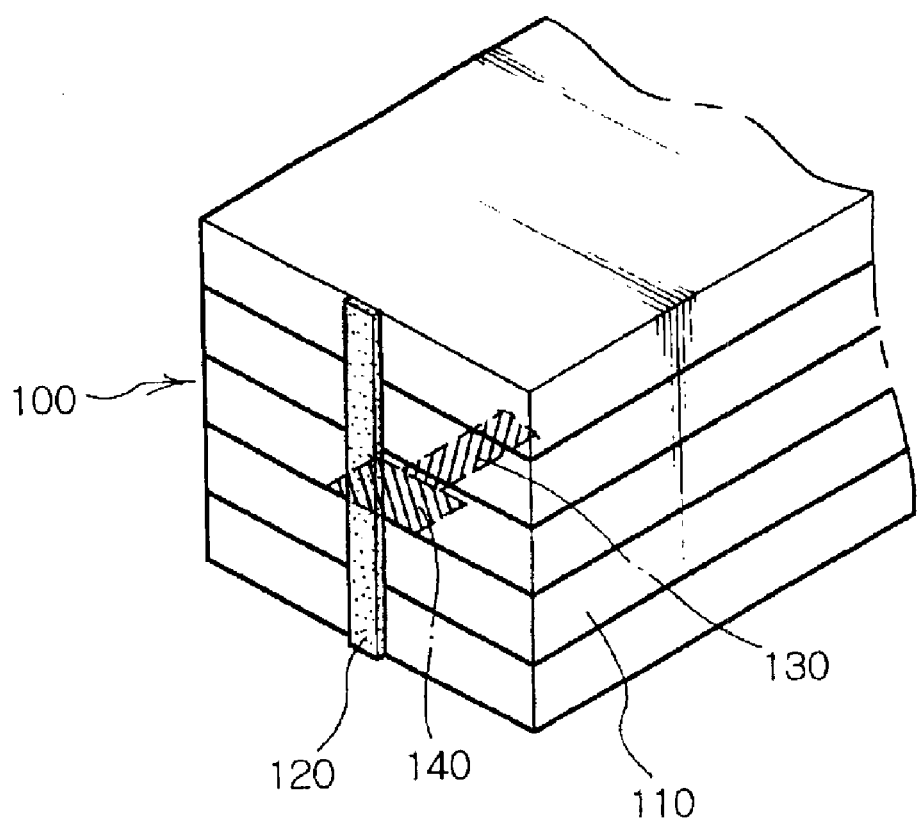
FIG. 4 is a perspective view of the ceramic multilayer substrate of FIG. 3.

Now, preferred embodiments of the present invention will be described in detail with reference to the annexed drawings. FIG. 3 is a plan view of a low temperature co-fired ceramic multilayer substrate in accordance with a first embodiment of the present invention, and FIG. 4 is a perspective view of the ceramic multilayer substrate of FIG. 3.

In accordance with the first embodiment, an external terminal 120 is longitudinally formed on an outer surface of the ceramic multilayer substrate 100. The ceramic multilayer substrate 100 comprises a plurality of ceramic substrates 110 being stacked vertically, and each substrate 110 has a designated thickness. A pattern layer 130 for forming circuit elements is formed on upper surfaces of parts or all of the plural ceramic substrates 110. Herein, the pattern layers 130 form various circuit elements within the ceramic multilayer substrate 100, and are connected to each other by via holes (not shown) formed in the ceramic multilayer substrate 100.

The ceramic substrate 110 is rectangular in shape. The plural ceramic substrates 110 are stacked vertically, and the external terminal 120 is longitudinally formed on the outer surface of the stack structure. The external terminal 120 is made of a metal deposition film, and used in signal input/output with the circuit elements embedded within the stack structure.

As shown in FIG. 3, an internal connection part 140 connected to the pattern layer 130 is formed on the ceramic substrate 110. Further, the internal connection part 140 is connected to the external terminal 120. The internal connection part 140 is not formed on all of the ceramic substrates 110, but formed on only parts of the ceramic substrate 110 having the pattern layer 130 for exchanging signals with the outside. The internal connection part 140 is connected to the external terminal 120 so as to exchange signals with the outside, and is broad enough to surround the external terminal 120. That is, the internal connection part 140 is formed on the ceramic substrate 110 by extending the pattern layer 130 to an edge of the ceramic substrate 110 provided with the external terminal 120. Preferably, the internal connection part 140 is made of a metal deposition film like the pattern layer 130.

FIG. 4 is a perspective view of the ceramic multilayer substrate 100 in accordance with the first embodiment of the present invention. As shown in FIG. 4, the ceramic multilayer substrate 100 is formed by stacking a plurality of the ceramic substrates 110, and the external terminal 120 is connected to the internal connection parts 140. Since a contact area between the internal connection part 140 and the external terminal 120 is large, although the external terminal 120 is slightly deviated from a correct position by an error occurring in a step for forming the through hole, it is still possible to form the connection therebetween. This effect will be described later in detail with reference to a second embodiment of the present invention.

Figure 5:
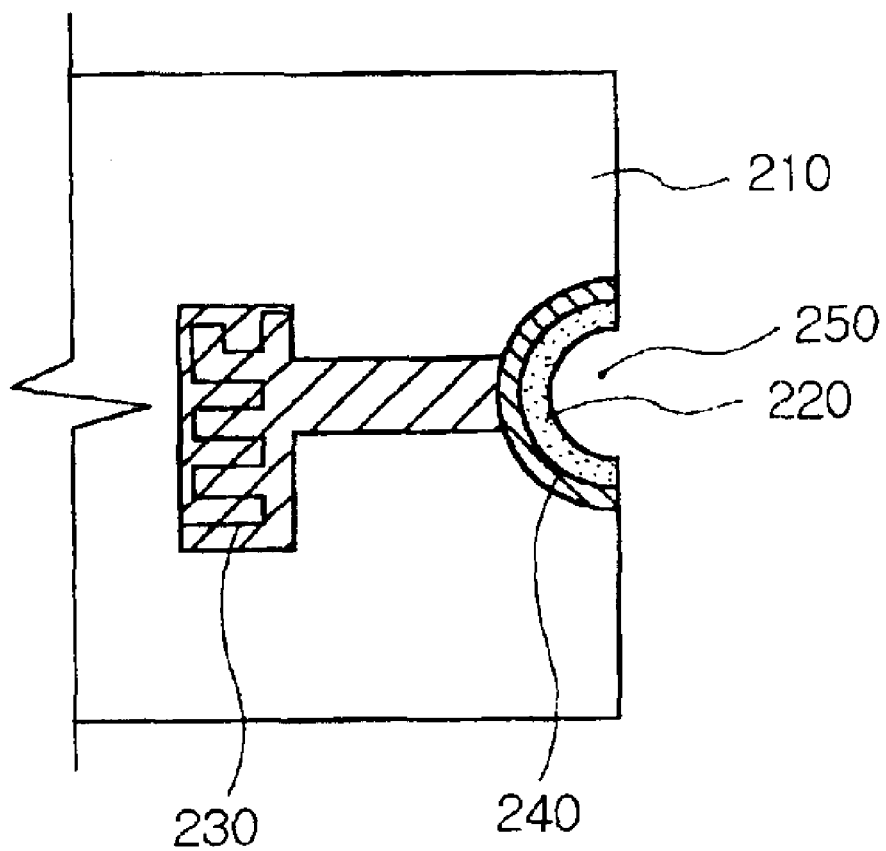
FIG. 5 is a plan view of one ceramic substrate of a low temperature co-fired ceramic multilayer substrate in accordance with a second embodiment of the present invention.
Figure 6:
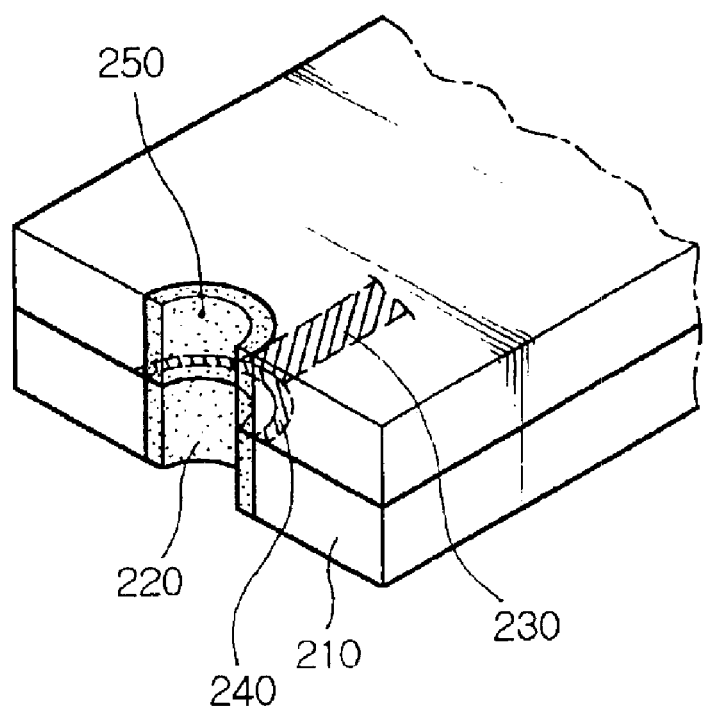
FIG. 6 is a perspective view of the ceramic multilayer substrate of FIG. 5.

FIG. 5 is a plan view of a low temperature co-fired ceramic multilayer substrate in accordance with a second embodiment of the present invention, and FIG. 6 is a perspective view of the ceramic multilayer substrate of FIG. 5. In accordance with the second embodiment, at least one through hole 250 is formed on an outer surface of a ceramic substrate 210 with a designated thickness. An internal connection part 240 is formed inside the through hole 250, and an external terminal 220 is formed outside the through hole 250.

The through hole 250 prevents the external terminal 220 from protruding from the outer surface of the ceramic multilayer substrate 210, and is used to form the external terminals 220 in a mass production process for forming plural multilayer substrates by cutting a single sheet provided with a plurality of the same patterns into plural sheets and vertically stacking the sheets. Herein, the through hole 250 of one ceramic substrate 210 is semicircular in shape.

Identically with the first embodiment, the ceramic multilayer substrate comprises a plurality of the ceramic substrates 210 being stacked vertically, and each substrate 210 has a designated thickness. A pattern layer 230 for forming circuit elements is formed on upper surfaces of parts or all of the plural ceramic substrates 210. The pattern layers 230 form various circuit elements within the ceramic multilayer substrate, and are vertically connected to each other by via holes (not shown) formed in the ceramic multilayer substrate.

When the ceramic substrates 210 are stacked vertically, the through holes 250 of the ceramic substrates 210 are connected to each other, thereby forming a longitudinal hole. Then, the external terminal 220 made of a metal deposition film is formed in the longitudinal hole and used in signal input/output with the circuit elements embedded in the ceramic multilayer substrate.

As shown in FIG. 5, the pattern layer 230 is formed on the ceramic substrate 210, and then the internal connection part 240 connected to the pattern layer 230 is formed so as to reach an edge of the ceramic substrate 210. The internal connection part 240 is semicircular in shape with a large size so as to surround the semicircular through hole 250. After the internal connection part 240 is formed on the ceramic substrate 210, the through hole 250 is formed through the ceramic substrate 210.

The number of the through holes 250 formed on the edges of the ceramic substrate 210 is the same as the number of the external terminals 220. Parts of the through holes 250 may be formed within the area of the internal connection part 240. Although the through hole 250 is deviated from a correct position by an error occurring in a step for forming the through hole, it is still possible to form a connection between the through hole 250 and the internal connection part 240. This means that the connection between the external terminal 220 formed on the outer surface of the through hole 250 and the internal connection part 240 is obtained even in the case of an error occurring in the process.

Figure 7:
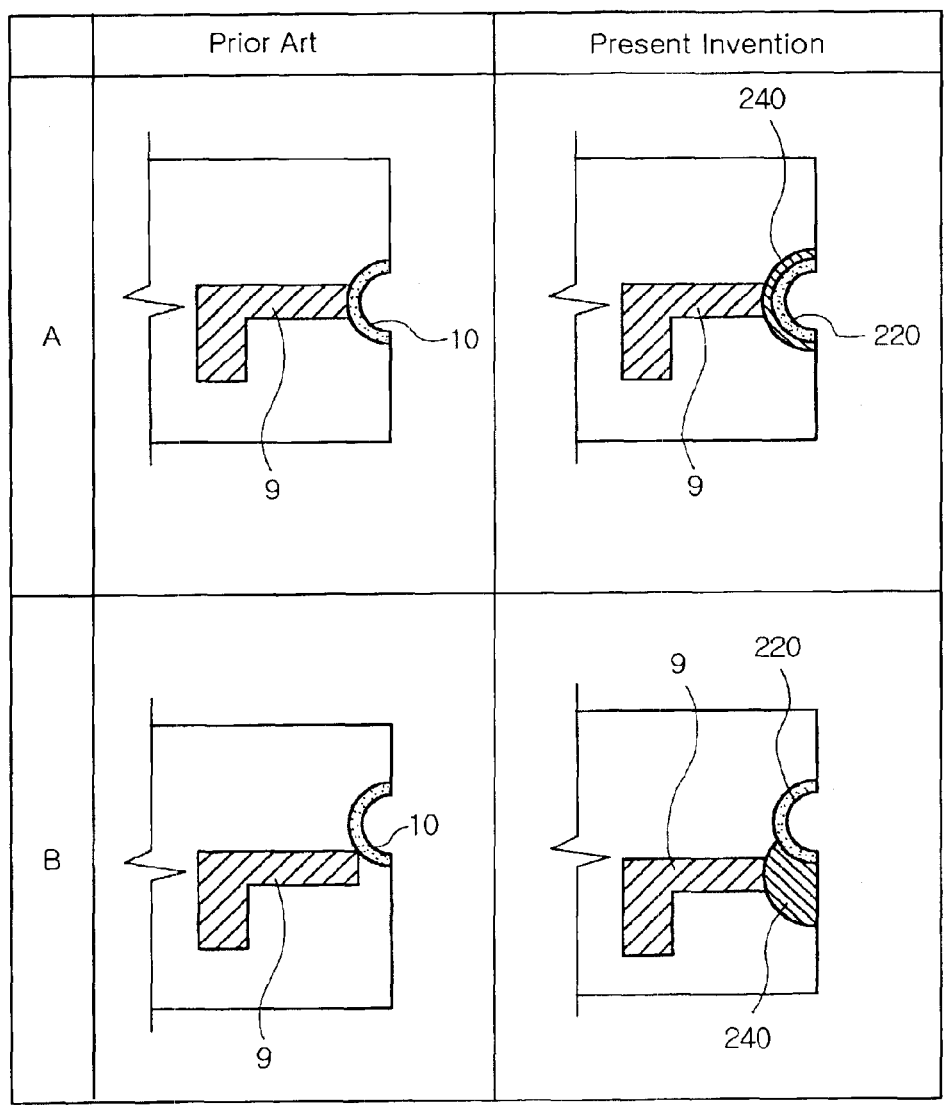
FIGS. 7A and 7B are schematic views for comparing a through hole of the present invention to a conventional through hole in case of an error generated in a step for forming the through hole.

Hereinafter, with reference to FIG. 7, this connection will be described in more detail. FIG. 7A comparatively shows conventional and present cases respectively, in which the through hole is formed at a correct position. In these conventional and present cases, the connection between the internal pattern 9 and the conventional external terminal 10 and the connection between the internal pattern 9 and the external terminal 220 of the present invention are all achieved. On the other hand, FIG. 7B comparatively shows conventional and present cases respectively, in which the through hole is slightly deviated from a correct position. At this time, in the conventional case, the connection between the pattern layer 9 and the external terminal 10 is not achieved. That is, the pattern layer 9 is not connected to the deviated through hole on the ceramic substrate, thereby not being connected to the external terminal 10 formed in the deviated through hole. However, in the present case in which the internal connection part 240 is broadly formed, although the through hole is slightly deviated from the correct position, the internal connection part 240 is still connected to the deviated through hole, thereby being connected to the external terminal 220. Therefore, the second embodiment of the present invention expands the range of an allowable error generated in the step for forming the through hole, thereby reducing a defective proportion of products, and uniformly controlling the quality of the products.

This effect is obtained by the first embodiment as well as the second embodiment. That is, in the first embodiment, a through hole is not formed on the ceramic substrate, but the external terminal is formed on the outer surface of the ceramic multilayer substrate by deposition. Herein, although the external terminal is slightly deviated from a correct position by an error generated in a step for forming the external terminal, the external terminal is located within the area of the broadly formed internal connection part. Thereby, the connection between the internal connection part and the external terminal is still achieved. As a result, the first embodiment also expands the range of an allowable error generated in the step for forming the through hole, thereby reducing the defective proportion of products, and uniformly controlling the quality of the products.

FIG. 6 shows the ceramic multilayer substrate formed by stacking a plurality of the ceramic substrates 210, each substrate 210 having the pattern layer 230 provided with the internal connection part 240, in accordance with the second embodiment of the present invention. As shown in FIG. 6, the external terminal 220 is formed in the through holes 250 of the ceramic multilayer substrate. A contact area between the external terminal 220 and the internal connection part 240 is larger than the conventional case. Preferably, the internal connection part 240 is made of a metal deposition film like the pattern layer 230.

Figure 8:
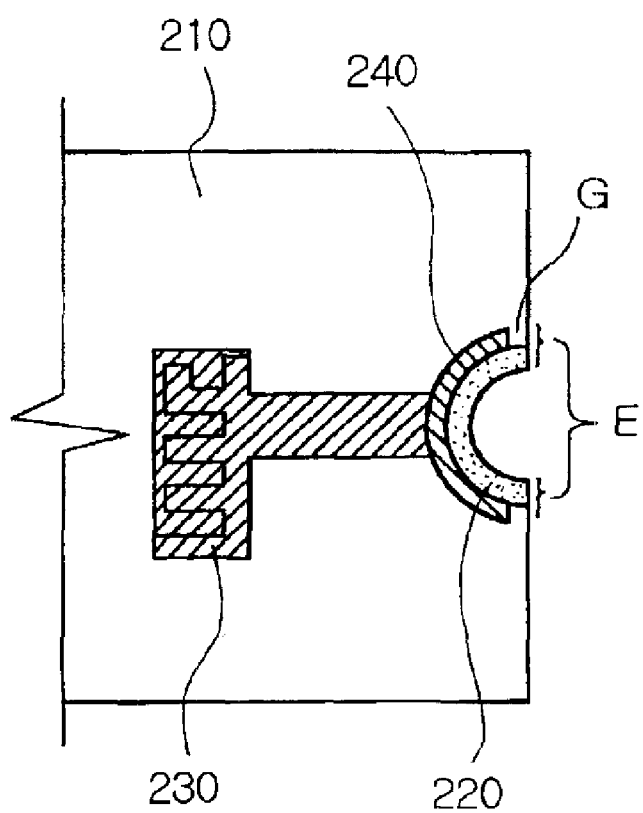
FIG. 8 is a plan view illustrating a modified example of an internal connection part in accordance with the second embodiment of shown in FIG. 5.
Figure 9:
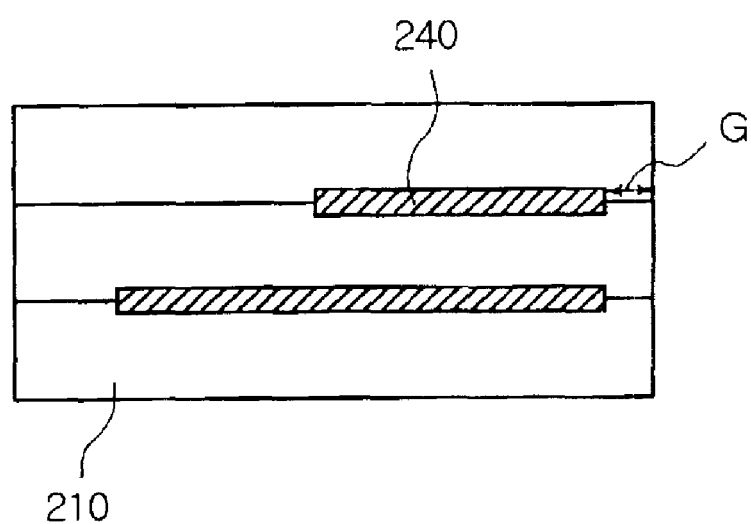
FIG. 9 is a cross-sectional view of a ceramic multilayer substrate employing the internal connection part of FIG. 8.

The ceramic multilayer substrate in accordance with the second embodiment may employ a modified internal connection part 240 as shown in FIG. 8. As shown in FIG. 8, the modified internal connection part 240 is separated from an edge (E) of the ceramic substrate 210 adjacent to the through hole 250 by a designated distance (G). The distance (G) prevents the internal connection part 240 from being extended to the outer wall of the ceramic substrate 210 and exposed at the outer wall of the ceramic multilayer substrate formed by stacking the plural ceramic substrate 210. FIG. 9 is a cross-sectional view of the ceramic multilayer substrate of FIG. 8, in which the internal connection parts 240 are not exposed at the outer wall of the ceramic multilayer substrate.

In case the internal connection part 240 is exposed at the outer wall of the ceramic multilayer substrate as shown in FIG. 6, the external terminal 220, which must be formed only in the through hole, may be formed on the outer wall of the ceramic multilayer substrate, thereby causing a poor appearance. Further, a gap is generated between the ceramic substrate and the exposed internal connection part due to a difference of contraction ratios between the ceramic substrate and the metallic internal connection part exposed at the outer wall of the ceramic substrate. In case electric components such as SAW filter chips are mounted in the ceramic multilayer substrate, a cavity for accommodating the SAW filter chips must be maintained under a nearly vacuum state. However, a pressure difference between the cavity of the ceramic multilayer substrate and the external atmosphere causes cracks in the substrate around the gap between the metallic internal connection part and the ceramic substrate, thereby breaking the vacuum state within the cavity.

Therefore, the multilayer substrate of the present invention may employ the internal connection part 240 separated from the edge of the ceramic substrate by the designated distance (G), as shown in FIG. 8, thereby preventing the generation of the gap in the outer wall of the ceramic substrate and preventing the above-described problems.

The multilayer substrate employing the internal connection parts of the present invention can be applied to various devices. Hereinafter, in accordance with a third embodiment, a method for manufacturing a multilayer substrate having SAW filter chips mounted therein will be described in detail.

A ceramic multilayer package for storing SAW filter chips under a vacuum state with a designated degree of vacuum is manufactured by using a low temperature co-fired ceramic processing technique. In order to integrate the SAW filters and peripheral filters into one component, products having a filter function within the above-described package manufactured by the low temperature co-fired ceramic processing technique have been applied to various electronic appliances.

Figure 10A:
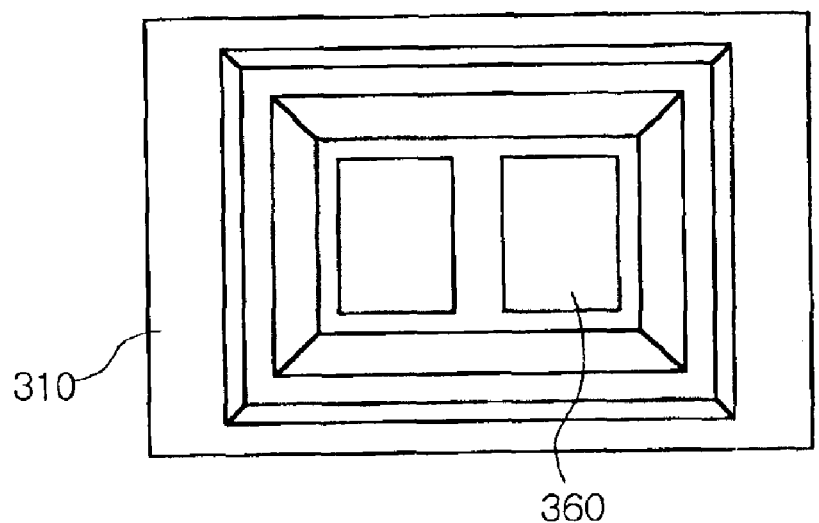
FIGS. 10A and 10B are a plan view and a cross-sectional view of a surface acoustic wave (SAW) filter package.
Figure 10B:
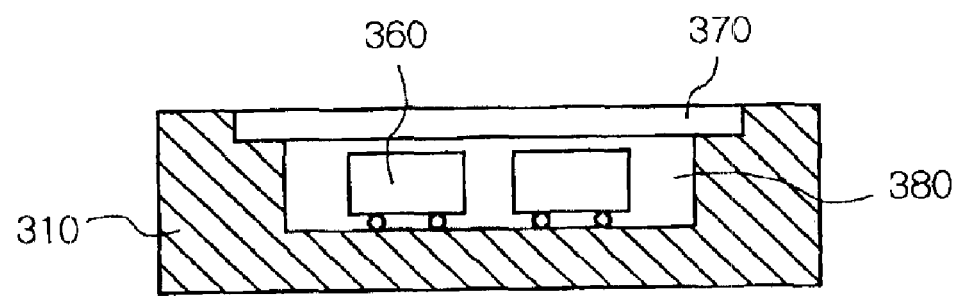
Figure 11:
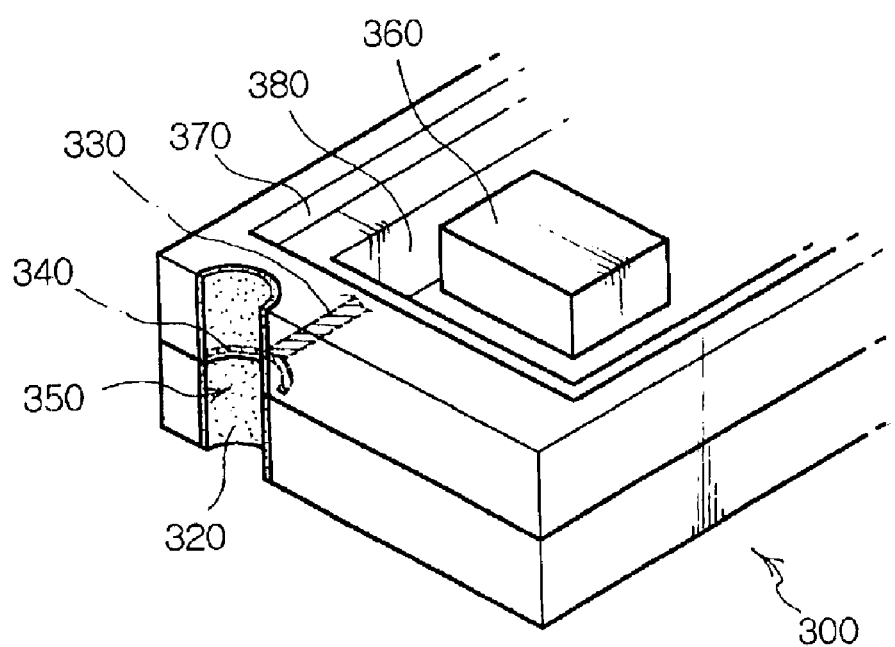
FIG. 11 is a perspective view of a surface acoustic wave filter package in accordance with a third embodiment of the present invention.
Figure 12C:
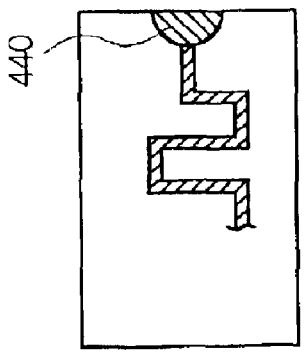
FIGS. 12A to 12F illustrate a method for manufacturing a ceramic multilayer substrate in accordance with the present invention.
Figure 12B:
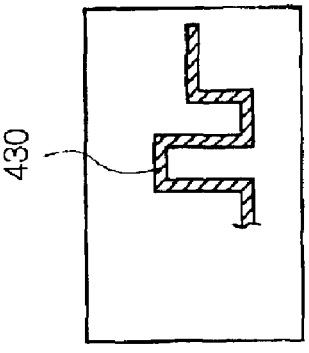
Figure 12A:
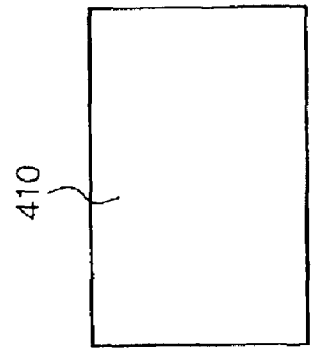
Figure 12F:
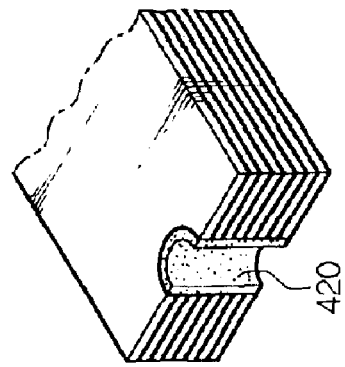
Figure 12E:
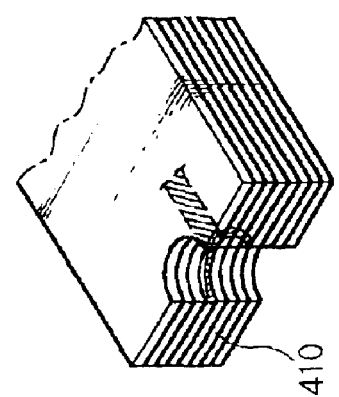
Figure 12D:
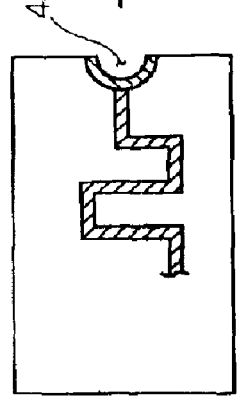

FIGS. 10A and 10B are a plan view and a cross-sectional view of a SAW filter package, and FIG. 11 is a perspective view of the SAW filter package. As shown in FIGS. 10 and 11, the SAW filter package comprises a plurality of ceramic substrates 310 being vertically staked up, and each substrate 310 has a designated thickness. Pattern layers 330 for forming circuit elements are formed on the ceramic substrate 310. A part of the pattern layers 330 adjacent to the edge of the ceramic substrate 310 is broader than other areas of the pattern layer 330 so as to exchange signals with the outside, thereby forming an internal connection part 340. The internal connection part 340 is broad enough to surround the external terminal 320. Further, a through hole 350 with a semicircular shape is formed on an edge of the ceramic substrate 310. The through hole 350 provides a space for forming an external terminal 320, and the internal connection part 340 has a size enough to surround the through hole 350. When the ceramic substrates 310 are stacked vertically so as to form one stack structure, the through holes 350 are connected to each other and forms a longitudinal hole, and the external terminal 320 is formed in the longitudinal hole by deposition.

The internal connection part 340 is made of the same metal as that of the pattern layer 330. Identically with the second embodiment, the internal connection part 340 is separated from a contact area of the external terminal 320 with the ceramic substrate 310, i.e., an edge of the ceramic substrate 310, by a designated distance.

A cavity 380 is formed through the stack structure formed by stacking the ceramic substrates 310. That is, a space for accommodating SAW chips 360 is formed on the upper surface of the stack structure, and at least one SAW chip 360 is mounted in the cavity 380. Then, the cavity 380 is covered by a cover 370 so as to maintain a designated degree of vacuum.

As described above, the technique in accordance with the present invention is applied to a SAW package 300. That is, the SAW filter is produced by forming the internal connection parts 340 so as to connect the external terminal 320 to the pattern layer 330 of the ceramic substrate 310. Since the stack structure achieved by the present invention solves the problems generated in maintaining a degree of vacuum within the cavity 380 of the SAW filter package 300, the present invention is usefully applied to the SAW filter package 300.

That is, the stack structure achieved by the present invention assures the stability of the connection between the external terminal and the internal pattern layers in the low temperature co-fired ceramic multilayer substrate, and simultaneously prevents the leakage of vacuum from a gap generated by a difference of contraction ratios in the stack substrate or moisture penetration into the gap.

Since the conventional package employing the low temperature co-fired ceramic multilayer substrate has gaps permitting external air or moisture to be penetrated into a cavity for accommodating SAW filter chips, the vacuum state of the package cannot be maintained. When at least two sheets are stacked vertically, and internal connection parts having a width larger than that of an external terminal and being connected to inner pattern layers are exposed at the outer wall of the package, gaps are generated within the package by means of a difference of contraction ratios between the sheet and the internal connection part, thereby causing air or moisture penetration therethrough.

Identically with the first and second embodiments, the SAW filter in accordance with the present invention comprises the internal connection parts formed so as to surround an area for the external terminal, thereby assuring the stability of the connection between the external terminal and the internal connection part. Further, identically with the second embodiment, the SAW filter in accordance with the present invention expands the range of an allowable error generated in the step for forming the through hole.

Moreover, identically with the modified second embodiment, the SAW filter in accordance with the present invention comprises the internal connection parts separated from the edge of the ceramic substrate by a designated distance so as not to expose the internal connection parts to the outer wall of the substrate, thereby preventing the generation of gaps within the stack structure and air or moisture penetration therethrough and preventing the external terminal from being deposited on the exposed metallic internal connection part.

The present invention further provides a method for manufacturing a low temperature co-fired ceramic multilayer substrate. FIGS. 12A to 12F illustrate respective steps of the method for manufacturing the low temperature co-fired ceramic multilayer substrate in accordance with the present invention.

Hereinafter, the method for manufacturing the low temperature co-fired ceramic multilayer substrate of the present invention will be described in detail with reference to FIGS. 12A to 12F.

A) A ceramic substrate 410 with a designated thickness is prepared.

B) A pattern layer 430 for forming circuit elements is formed on the ceramic substrate 410. The plural pattern layers 430 of the vertically stacked ceramic substrates 410 form various circuit elements. Generally, the pattern layer 430 has a width smaller than that of an external terminal formed later.

C) An internal connection part 440 is formed on a part of the pattern layer 430 and connected to an edge of the ceramic substrate 410 so as to exchange signals with the outside, and has a width larger than that of the pattern layer 430. The internal connection part 440 is semicircular in shape as shown in FIG. 12. The external terminal will be formed later within an area of the semicircular internal connection part 440. The internal connection part 440 is made of the same metal as that of the pattern layer 430.

D) An opened through hole 450 having a semicircular shape is formed on an edge of the ceramic substrate 410 within the area of the internal connection part 440. Since the through hole 450 with a circular shape is formed across two neighboring ceramic substrates 410, the through hole 450 formed on a single ceramic substrate 410 is semicircular in shape. Preferably, the through hole 450 is formed within the area of the internal connection part 440 so as to be surrounded by the internal connection part 440. However, although the through hole 450 is slightly deviated from a correct position by an error generated in a step for forming the through hole 450, the through hole 450 is still located within the area of the internal connection part 440, thereby expanding the range of an allowable error in the process.

E) A plurality of the ceramic substrates 410 formed by the aforementioned steps are stacked vertically. Each of the stacked ceramic substrates 410 respectively has the through hole 450 formed at the same position. Therefore, the through holes 450 are connected to each other and form a longitudinal hole.

F) An external terminal 420 is formed in the longitudinal hole so as to be electrically connected to the internal connection parts 440.

Figure 13:
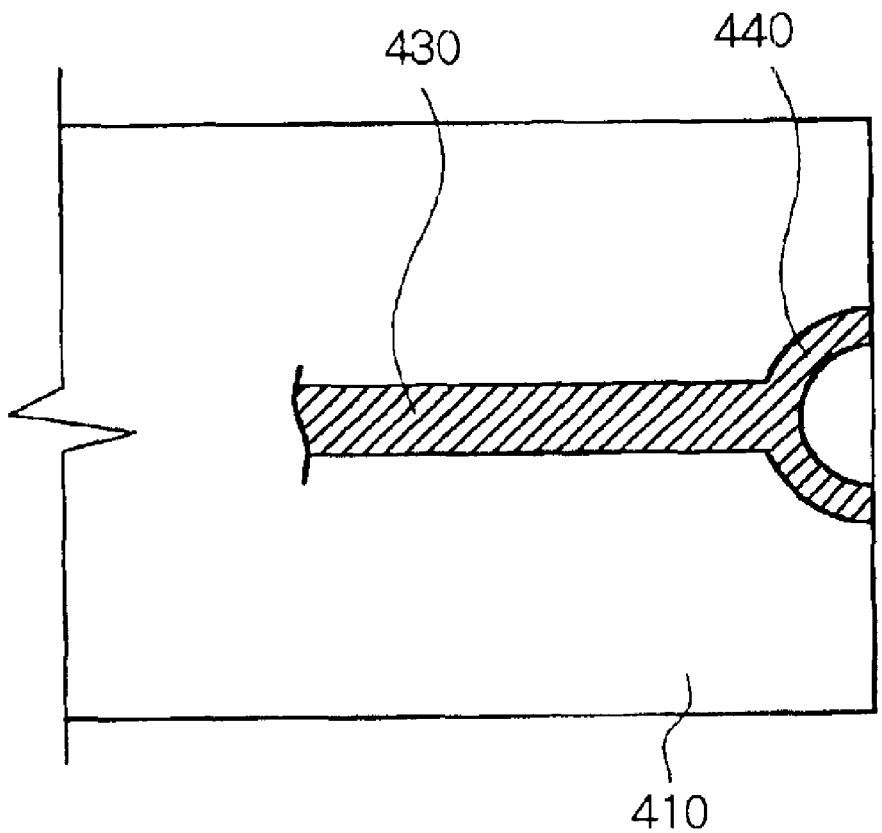
FIG. 13 is a plan view illustrating the modified example of the internal connection part of the ceramic multilayer substrate in accordance with the present invention.

In the above-described manufacturing method, the internal connection part 440 may be U-shaped so that an internal diameter of the internal connection part 440 is smaller than a radius of the through hole 450 and an outer diameter of the internal connection part 440 is larger than the radius of the through hole 450. That is, as shown in FIG. 13, a metal deposition film for forming the internal connection part 440 is not formed on an area for the through hole 450, thereby preventing the metal deposition film from extending toward the outer surface of the ceramic substrate and reducing the consumption amount of the film material.

Further, preferably, the internal connection part 440 is separated from the edge of the substrate 410 adjacent to the external terminal 420 by a designated distance. Therefore, a stable connection between the internal connection part 440 and the external terminal 420 is obtained, and the metallic internal connection part 440 is prevented from being exposed at the outer wall of the stack structure, thereby preventing the generation of gaps between the ceramic substrates 410.

The present invention further provides a method for manufacturing a ceramic multilayer substrate for mounting SAW chips, in which a vacuum state within a cavity for accommodating the SAW chips is effectively maintained. FIGS. 14A to 14G illustrate respective steps of the method for manufacturing the ceramic multilayer substrate for mounting SAW chips in accordance with the present invention. Hereinafter, the method for manufacturing the ceramic multilayer substrate for mounting SAW chips of the present invention will be described.

A) A ceramic substrate 510 with a designated thickness is prepared.

B) A pattern layer 530 for forming circuit elements is formed on the ceramic substrate 510. The plural pattern layers 530 of the vertically stacked ceramic substrates 510 form various circuit elements. Generally, the pattern layer 530 has a width smaller than that of an external terminal formed later.

C) An internal connection part 540 is formed on a part of the pattern layer 530 and connected to an edge of the ceramic substrate 510 so as to exchange signals with the outside, and has a width larger than that of the pattern layer 530. The internal connection part 540 is semicircular in shape as shown in FIG. 14. The external terminal will be formed later within an area of the semicircular shape of the internal connection part 540. The internal connection part 540 is made of the same metal as that of the pattern layer 530. As described in the above second embodiment, the internal connection part 540 is separated from the edge of the ceramic substrate 510 by the designated distance (G), thereby preventing the internal connection part 540 from being exposed at the outer surface of the ceramic substrate 510 and maintaining a vacuum state within the substrate 510.

D) An opened through hole 550 having a semicircular shape is formed on an edge of the ceramic substrate 510 within the area of the internal connection part 540. Since the through hole 550 with a circular shape is formed across two neighboring ceramic substrates 510, the through hole 550 formed on a single ceramic substrate 510 is semicircular in shape. Preferably, the through hole 550 is formed within the area of the internal connection part 540 so as to be surrounded by the internal connection part 540. However, although the through hole 550 is slightly deviated from a correct position by an error generated in a step for forming the through hole 550, the through hole 550 is still located within the area of the internal connection part 540, thereby expanding the range of an allowable error in the process.

E) A plurality of the ceramic substrates 510 formed by the aforementioned steps are stacked vertically. A cavity 560 for accommodating electronic components therein is formed in the upper surface of the stack structure. Each of the stacked ceramic substrates 510 respectively has the through hole 550 formed at the same position. Therefore, the through holes 550 are connected to each other and form a longitudinal hole.

F) An external terminal 520 is formed in the longitudinal hole so as to be electrically connected to the internal connection parts 540.

G) Electronic components 570 are mounted within the cavity 560, and the cavity 560 is covered with a cover 580 so as to maintain a vacuum state therein. Herein, the electronic components may be SAW chips required to be stored under a designated a degree of vacuum.

In the above-described manufacturing method, as shown in FIG. 13, the internal connection part 540 may be U-shaped so that an internal diameter of the internal connection part 540 is smaller than a radius of the through hole 550 and an outer diameter of the internal connection part 540 is larger than the radius of the through hole 550. That is, a metal deposition film for forming the internal connection part 540 is not formed on an area for the through hole 550, thereby preventing the metal deposition film from being expanded toward the outer surface of the ceramic substrate and reducing the consumption amount of the film material.

As apparent from the above description, since internal connection parts being broader than the inner pattern layers are connected to inner pattern layers and external terminals, a large connection area between the internal connection parts and the external terminals is obtained.

When the internal connection parts are broadly formed on the substrate, even in the case of an error occurring in a step for forming through holes, the through holes are still located within the area of the internal connection parts so that the internal connection parts can be connected to the external terminal. Therefore, compared to the conventional case, the present invention increases the range of an allowable error generated in the process, thereby reducing the defective percentage of products and uniformly controlling quality of the products.

Further, the internal connection parts may be separated from the edge of the substrate by a designated distance. This separation prevents the leakage of vacuum from a gap generated by a difference of contraction ratios between elements of the stacked ceramic substrates and/or moisture penetration into the gap, and prevent the generation of cracks in the substrate around the gap.

Moreover, the present invention provides a low temperature co-fired ceramic multilayer substrate for mounting SAW chips in which a degree of vacuum within a cavity for accommodating the SAW chips therein is maintained, thereby forming a SAW filter package.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A ceramic multilayer substrate, comprising:
   a plurality of ceramic substrates being stacked vertically;
   pattern layers formed on surfaces of the ceramic substrates so as to form circuit elements;
   at least one external terminal formed vertically on side surfaces of the stacked ceramic substrates; and
   at least one internal connection part which is formed on a part of at least one of the pattern layers, is connected to the external terminal so as to exchange signals with the outside, and is sufficiently broad to surround the external terminal.

2. The ceramic multilayer substrate as set forth in claim 1, wherein the internal connection parts are made of the same metallic materials as the pattern layers.

3. The ceramic multilayer substrate as set forth in claim 1, wherein said at least one external terminal extends continuously and vertically on the side surfaces of at least two adjacent ones of said stacked ceramic substrates.

4. The ceramic multilayer substrate as set forth in claim 1, wherein said at least one external terminal extends continuously and vertically on the side surfaces of all said stacked ceramic substrates.

5. A ceramic multilayer substrate, comprising:
   a plurality of ceramic substrates being stacked vertically, each substrate including at least one through hole formed on a side surface thereof;
   pattern layers formed on surfaces of the ceramic substrates so as to form circuit elements;
   at least one external terminal formed on an inside wall of the through hole of the stacked ceramic substrates; and
   at least one internal connection part which is formed on a part of at least one of the pattern layers, is connected to the external terminal so as to exchange signals with the outside, and is sufficiently broad to surround the external terminal.

6. The ceramic multilayer substrate as set forth in claim 5, wherein the internal connection parts are spaced from the side surfaces of the ceramic substrates adjacent to the through holes.

7. The ceramic multilayer substrate as set forth in claim 6, further comprising:
a cavity formed in an upper surface of the stacked ceramic substrates;
electronic components mounted within the cavity; and
a cover installed above the cavity so as to maintain a vacuum state within the cavity.

8. The ceramic multilayer substrate as set forth in claim 7, wherein the electronic components are surface acoustic wave (SAW) filter chips.

9. The ceramic multilayer substrate as set forth in claim 7, wherein the through hole is vertical and semicircular in shape so as to be opened to the outside.

10. The ceramic multilayer substrate as set forth in claim 7, wherein the internal connection parts are made of the same metallic materials as the pattern layers.

11. The ceramic multilayer substrate as set forth in claim 5, wherein the through hole is vertical and semicircular in shape so as to be opened to the outside.

12. The ceramic multilayer substrate as set forth in claim 5, wherein the internal connection parts are made of the same metallic materials as the pattern layers.

13. The ceramic multilayer substrate according to claim 5, wherein said at least one internal connection part and the at least one pattern layer connected thereto are entirely positioned within one surface of one of the substrates.

14. A method for manufacturing a ceramic multilayer substrate, comprising the steps of:
preparing ceramic substrates, each substrate having a designated thickness;
forming pattern layers on surfaces of the ceramic substrates so as to form circuit elements;
forming internal connection parts, each of which is formed on a part of the pattern layer, being connected to an edges of the ceramic substrates so as to exchange signals with the outside and having a width larger than the width of the connected pattern layers;
forming through holes on the edges of the ceramic substrates within areas of the internal connection parts, the through holes being semicircular in shape so as to be opened to the outside;
stacking a plurality of the ceramic substrates; and
forming an external terminal on the through holes of the stacked ceramic substrates so as to be electrically connected to the internal connection parts.

15. A ceramic multilayer substrate, comprising:
a plurality of ceramic substrates vertically stacked one upon another, each of said ceramic substrates having opposite upper and lower surfaces and at least a side surface extending vertically between said upper and lower surfaces; and
an external terminal vertically extending continuously on the side surfaces of said ceramic substrates;
wherein at least one of said substrates includes at least one conductive pattern on the upper surface thereof, and said at least one conductive pattern is in direct physical and electrical contact with said external terminal over an entire first extent over which said external terminal extends along a boundary between the upper surface and the side surface of said at least one substrate.

16. The ceramic multilayer substrate according to claim 15, wherein said at least one conductive pattern extends along said boundary over a second extent equal to or greater than the first extent.

17. The ceramic multilayer substrate according to claim 16, wherein said boundary is a straight line located in a horizontal plane.

18. The ceramic multilayer substrate according to claim 15, wherein said boundary is a curved line located in a horizontal plane and curved inwardly of said at least one substrate.

19. A ceramic multilayer substrate, comprising:
a plurality of ceramic substrates vertically stacked one upon another, each of said ceramic substrates having opposite upper and lower surfaces and at least a side surface extending vertically between said upper and lower surfaces; and
an external terminal vertically extending continuously on the side surfaces of said ceramic substrates;
wherein
at least one of said substrates includes at least one conductive pattern on the upper surface thereof;
said at least one conductive pattern includes a portion extending towards the side surface of said at least one substrate and terminates at an enlarged end in direct physical and electrical contact with both said portion and said external terminal; and
said at least one conductive pattern and said external terminal have, at said enlarged end, a contact area greater than what they would have had if said enlarged end had not been formed and said portion had been extended up to said side surface to directly, physically and electrically contact the external terminal.

20. The ceramic multilayer substrate according to claim 19, wherein said portion is straight and has a substantially uniform width which is smaller than a length of said enlarged end as measured along a boundary between the upper surface and the side surface of said at least one substrate.

21. The ceramic multilayer substrate according to claim 20, wherein said enlarged end extends on opposite sides and transversely of said portion.

22. The ceramic multilayer substrate according to claim 19, wherein said enlarged end is in direct physical and electrical contact with said external terminal over an entire extent over which said external terminal extends along a boundary between the upper surface and the side surface of said at least one substrate.

23. The ceramic multilayer substrate according to claim 19, wherein said side surface is generally planar except for a notch on a wall of which the external terminal is formed, said enlarged portion having a shape conforming with a cross section of said notch, being in direct physical and electrical contact with said external terminal only within said notch, and being physically spaced in a longitudinal direction of said portion from planar regions of said side surface.

* * * * *